United States Patent
Kim et al.

(10) Patent No.: US 6,620,684 B2
(45) Date of Patent: Sep. 16, 2003

(54) METHOD OF MANUFACTURING NONVOLATILE MEMORY CELL

(75) Inventors: Jum Soo Kim, Kyungki-Do (KR); Sung Mun Jung, Kyungki-Do (KR); Sang Bum Lee, Chungcheongbuk-Do (KR); Min Kuck Cho, Kyungki-Do (KR); Young Bok Lee, Kyungki-Do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 9 days.

(21) Appl. No.: 10/029,391

(22) Filed: Dec. 28, 2001

(65) Prior Publication Data

US 2003/0003657 A1 Jan. 2, 2003

(30) Foreign Application Priority Data

Jun. 29, 2001 (KR) ........................................ 2001-38417

(51) Int. Cl.$^7$ ............................................. H01L 21/336
(52) U.S. Cl. ........................ 438/257; 438/262; 438/264; 438/266; 257/315; 257/320
(58) Field of Search ................................. 438/201, 257, 438/258, 259, 260, 261, 262, 263, 264, 265, 266, 592, 593, 594, 595, 652, 656, 657; 257/314, 315, 316, 317, 320, 321, 322, 326

(56) References Cited

U.S. PATENT DOCUMENTS 6,143,609 A * 11/2000 Sato et al. ................... 438/266
6,288,419 B1 * 9/2001 Prall et al. ................... 257/213

OTHER PUBLICATIONS

Byung Hak Lee et al., "In–situ Barrier Formation for High Reliable W/barrier/poly–Si Gate Using Denudation of $WN_x$ on Polycrystalline Si". 1998 IEEE.

* cited by examiner

Primary Examiner—Jack Chen
(74) Attorney, Agent, or Firm—Morgan, Lewis & Bockius LLP

(57) ABSTRACT

The present invention relates to a method of manufacturing a nonvolatile memory cell. The present invention uses tungsten (W) as an upper layer of a control gate electrode in order to integrate the memory cell and performs an ion implantation process for forming a source region and a drain region before a selective oxidization process that is performed to prevent abnormal oxidization of tungsten (W). Therefore, the present invention can reduce a RC delay time of word lines depending on integration of the memory cell and also secure a given distance between a silicon substrate and a tunnel oxide film. As a result, the present invention can solve a data retention problem of the flash memory.

6 Claims, 12 Drawing Sheets

Ion Implantation

Selective Oxidation

Second Seletive Oxidation

METHOD OF MANUFACTURING NONVOLATILE MEMORY CELL

BACKGROUND OF THE INVENTION

1. Field of the Invention

The invention relates generally to a method of manufacturing a nonvolatile memory cell, and more particularly to, a method of manufacturing a nonvolatile memory cell capable of enhancing a retention characteristic of the nonvolatile memory using selective oxidation.

2. Description of the Prior Art

Semiconductor memory device can be classified into RAM (random access memory) products such as DRAM (dynamic random access memory) and SRAM (static random access memory), and ROM (read only memory). RAM is volatile since the data in RAM is lost in time but ROM is nonvolatile since the data in ROM is not lost. Also, the input/output speed of data in RAM is fast but the input/output speed of data in ROM is low. This ROM product family may include ROM, PROM (programmable ROM), EPROM (erasable programmable ROM) and EEPROM (electrically erasable programmable read-only memory). Among them, a demand for EEPROM from which data is electrically programmable and erasable has been increased. The EEPROM or a flash EEPROM has a stack type gate structure in which a floating gate electrode and a control gate electrode are stacked.

The memory cell of the stack type gate structure programs/erases data by means of Fowler-Nordheim (F-N) tunneling and has a tunnel oxide film, a floating gate electrode, a dielectric film and a control gate electrode stacked on a semiconductor substrate. The gate electrodes have a stack structure in which a polysilicon layer into which an impurity having a strong heat-resistance is doped or a polysilicon layer and a tungsten silicide (WSix) are stacked.

Generally, after the gate electrodes are formed, a high temperature annealing process for compensating for etching damage generated when a pattern of the gate electrode is formed is performed. At this time, however, there occurs a GGO (graded gate oxide) phenomenon in which a silicon substrate at an edge portion of the tunnel oxide film is oxidized/grown due to the annealing process. The GGO phenomenon is generated between the floating gate electrode and the semiconductor substrate to keep them by a given distance, thus solving a retention problem that is most important in the nonvolatile memory.

There was proposed "In-situ barrier formation for high reliable W/barrier/poly-Si gate using denudation of WNx on polycrystalline Si, LG, SEMICONDUCTOR CO. LTD., issued by Byung-Hak Lee etc. (IEEE, 1998). This paper proposes a resistance variation ratio to the width of the gate electrode formed of tungsten silicide (WSix) or tungsten (W).

Seeing a characteristic graph relating to the resistance variation ratio to the width of the gate electrode shown in this paper, if the width of the gate electrode is reduced to below 0.2 $\mu$m, the resistance of the gate electrode formed of tungsten silicide (WSix) is abruptly increased while the resistance of the gate electrode formed of tungsten (W) is almost constant with no regard to reduced width. In other words, as the wired of the gate electrode formed of tungsten silicide (WSix) is reduced to below 0.2 $\mu$m, the resistance is abruptly increased while the resistance of the gate electrode formed of tungsten (W) is almost constant with no regard to reduced width.

Therefore, when the gate electrode is formed of tungsten silicide (WSix), there is a problem that a RC delay time is delayed since the resistance is increased as the memory cell is higher integrated. Due to this, there is a need for a method for forming a gate electrode using tungsten (W) in order to implement higher integrated memory cell.

However, tungsten (W) is abnormally oxidized since it easily reacts with oxygen at a high temperature. Therefore, there occurs a problem that an upper surface characteristic of the gate electrode is degraded since tungsten (W) is abnormally oxidized at a high temperature annealing process. Recently, in order to solve this problem, there has been proposed a selective oxidation process instead of the high temperature annealing process. Though the selective oxidation process can prevent abnormal oxidization of tungsten (W), it does not sufficiently oxidize the upper surface of the semiconductor substrate at an edge portion of the tunnel oxide film. Thus, there is a problem that it does not solve a retention problem of the nonvolatile memory cell.

Therefore, there is a need for a method capable of solving a retention problem in a nonvolatile memory cell when a gate electrode is formed using tungsten (W).

SUMMARY OF THE INVENTION

It is therefore an object of the present invention to provide a method of manufacturing a nonvolatile memory cell capable of solving a high temperature annealing problem occurring when a gate electrode is used, in a way that the gate electrode is formed using tungsten (W) in order to implement integration of the nonvolatile memory cell.

In order to accomplish the above object, a method of manufacturing a nonvolatile memory cell according to the present invention, is characterized in that it comprises the steps of forming a tunnel oxide film, a floating gate electrode, a dielectric film and a control gate electrode on a semiconductor substrate; forming source and drain region by means of source/drain ion implantation process; forming an oxide layer on the source and drain region by means of selective oxidization process; and forming spacers on both sides of the floating gate electrode and the control gate electrode.

Also, a method of manufacturing a nonvolatile memory cell according to the present invention, is characterized in that it comprises the steps of sequentially forming a tunnel oxide film, a first polysilicon layer, a dielectric film, a second polysilicon layer, a tungsten layer and a hard mask layer a semiconductor substrate; etching the hard mask layer, the tungsten layer, the second polysilicon layer and the dielectric film in one direction to form a control gate electrode; performing a first selective oxidization process to form a first oxide layer on both sides of the second polysilicon layer and the dielectric film; forming a first spacer on both sides of the control gate electrode; etching the first polysilicon layer and the tunnel oxide film to form a floating gate electrode; performing source/drain ion implantation process to form a source and drain region; performing a selective oxidization process to form a second oxide film on the source and drain region; and forming a second spacer on both sides of the floating gate electrode and the control gate electrode.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings.

Figure 1:
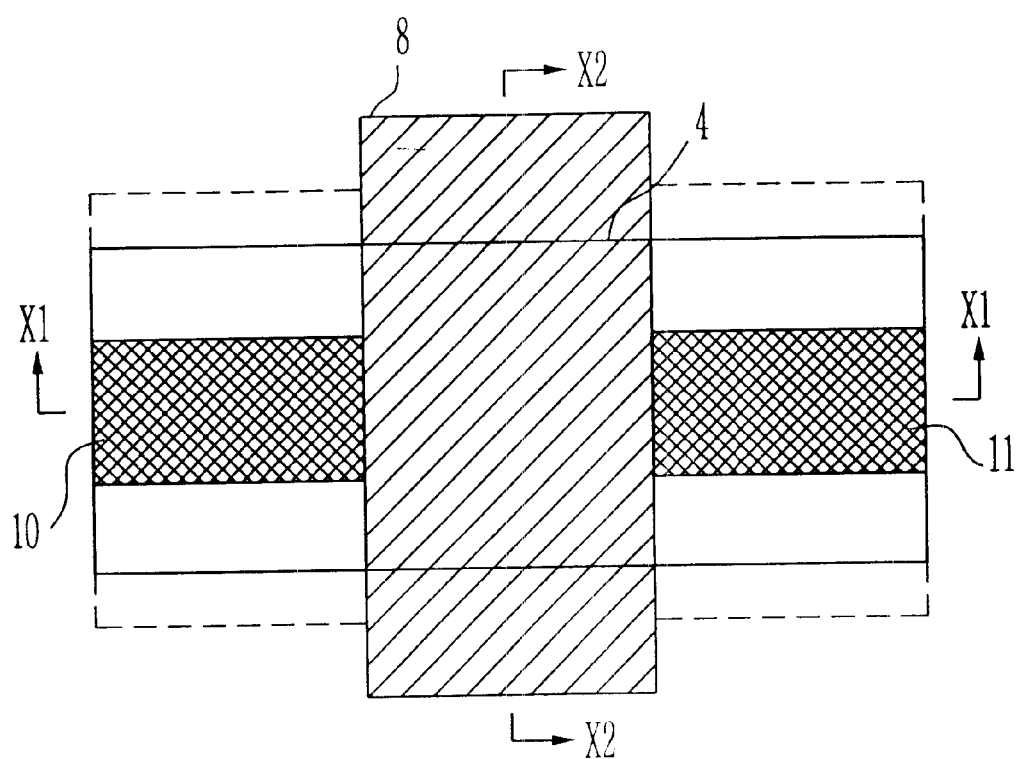
FIG. 1 is a plan view of a nonvolatile memory cell according to first and second embodiments of the present invention.
Figure 2:
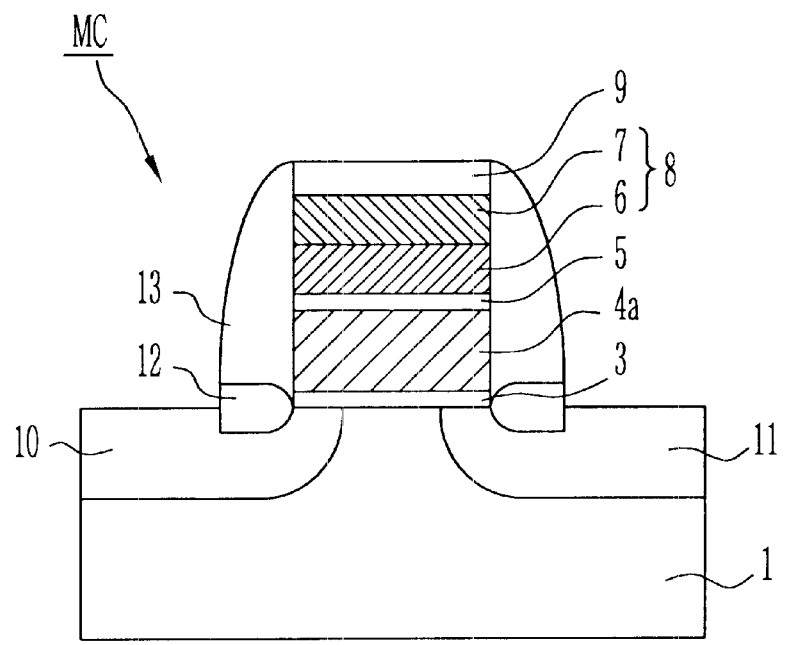
FIG. 2 is a cross-sectional view of the nonvolatile memory cell taken along lines 'X1—X1' in FIG. 1 according to the first embodiment of the present invention.
Figure 3:
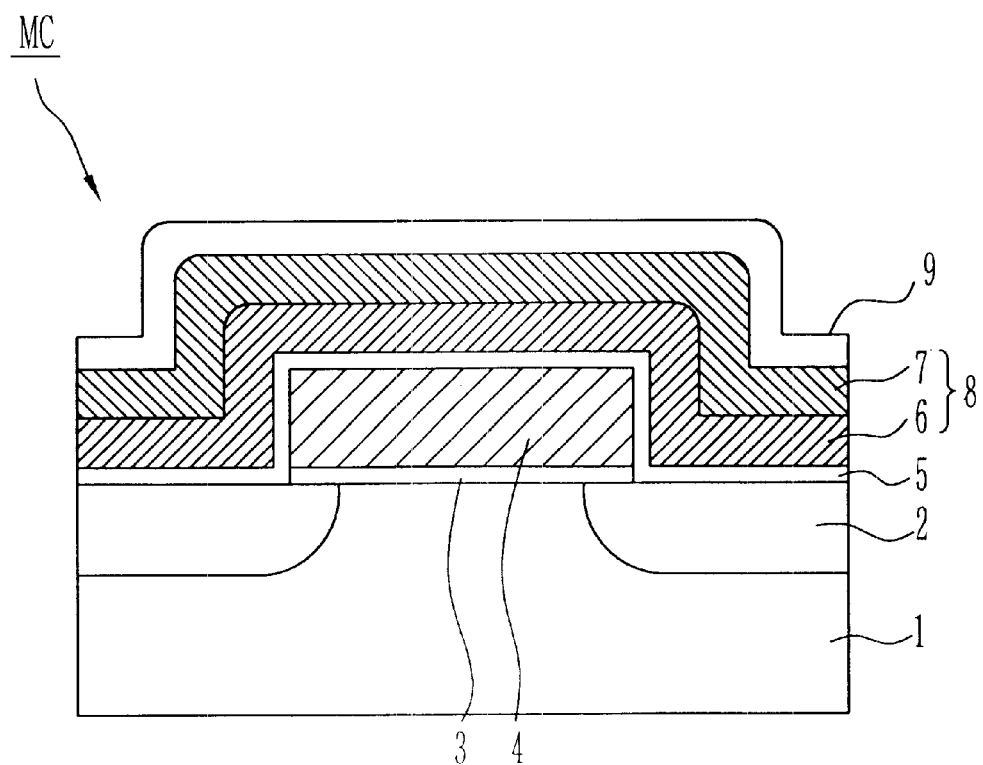
FIG. 3 is a cross-sectional view of the nonvolatile memory cell taken along lines 'X2—X2' in FIG. 1 according to the first embodiment of the present invention.

FIG. 1 is a plan view of a nonvolatile memory cell according to first and second embodiments of the present invention, FIG. 2 is a cross-sectional view of the nonvolatile memory cell taken along lines 'X1—X1' in FIG. 1, and FIG. 3 is a cross-sectional view of the nonvolatile memory cell taken along lines "X2—X2' in FIG. 1. It should be understood that the present invention gives an example of one flash memory cell as a device including a nonvolatile memory cell.

Referring now to FIGS. 1~3, a control gate electrode 8 shown in the drawings functions as a control gate line of a plurality of memory cells MC. A floating gate electrode 4a is positioned in each of the memory cell MC and is electrically floated.

A semiconductor substrate 1 is provided and a device isolation film 2 for separating active regions and a plurality of device isolation regions for separating the active regions is formed in the semiconductor substrate 1. A source region 10 and a drain region 11 are formed in the active region. A tunnel oxide film 3, a floating gate electrode 4a, a dielectric film (ONO) 5, a control gate electrode 8 and a hard mask layer 9 are sequentially stacked on the active region in the semiconductor substrate 1. At this time, the first polysilicon layer 4 is formed and is then etched to form the floating gate electrode 4a. The control gate electrode 8 has a stack structure in which the second polysilicon layer 6 as an lower layer and the tungsten nitride film (WN)/tungsten (W) 7 as an upper layer are stacked.

Generally, in a NOR type flash memory, bit lines (not shown) being a common line of the plurality of the memory cells MC are connected to the drain region 11 of the memory cell MC and the source region 10 being a diffusion layer line is formed in parallel to the direction along which the control gate electrode 8 extends. At this time, the diffusion layer line functions as a common line (common source region) between the plurality of the memory cells MC.

The major characteristics of the nonvolatile memory cell in the first embodiment lies in that it forms the control gate electrode 8 having a stack structure of polysilicon 6 and tungsten (W) 7 and forms an oxide layer 12 on the source region 10 and the drain region 11 at an edge portion of the tunnel oxide film 3, in order to prevent a retention problem of the memory cells.

In order to implement the above characteristics, in the first embodiment, a pattern of the control gate electrode 8 and the floating gate electrode 4a are formed and an ion implantation for the source region 10 and the drain region 11 is then formed before the selective oxidization process that is performed for the entire surface of the semiconductor substrate 1. As a result, abnormal oxidization of tungsten (W) 7 can be prevented and the oxide layer 12 can be formed on the source region 10 and the drain region 11 at the edge portion of the tunnel oxide film 3.

A method of manufacturing the memory cell of the first embodiment will be described by reference to FIGS. 4A~12.

FIGS. 4A, 5A, 6A, 7A, 8A, 9A, 10, 11 and 12 are cross-sectional views of the memory cell taken along lines 'X1—X1' in FIG. 1 and FIGS. 4B, 5B, 6B, 7B, 8B and 9B are cross-sectional views of the memory cell taken along lines 'X2—X2' in FIG. 1.

Figure 4A:
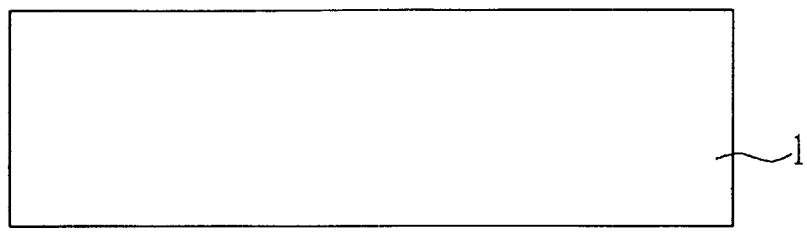
FIGS. 4A, 5A, 6A, 7A, 8A, 9A, 10, 11 and 12 are cross-sectional views of the memory cell taken along lines 'X1—X1' in FIG. 1, for explaining a process of manufacturing the nonvolatile memory cell shown in FIG. 2.
Figure 4B:
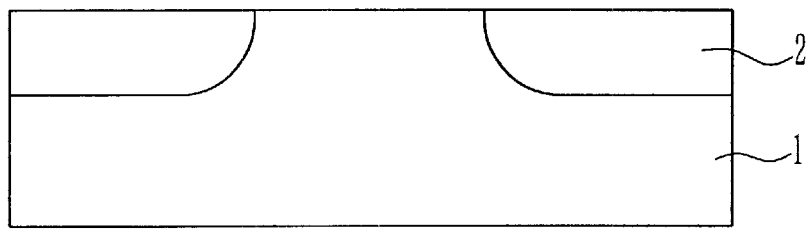
FIGS. 4B, 5B, 6B, 7B, 8B and 9B are cross-sectional views of the memory cell taken along lines 'X2—X2' in FIG. 1, for explaining a process of manufacturing of the nonvolatile memory cell shown in FIG. 3.

Referring now to FIGS. 4A and 4B, the semiconductor substrate 1 is prepared. A device isolation film 2 is selectively formed in a device isolation region for defining an active region in the semiconductor substrate 1.

Figure 5A:
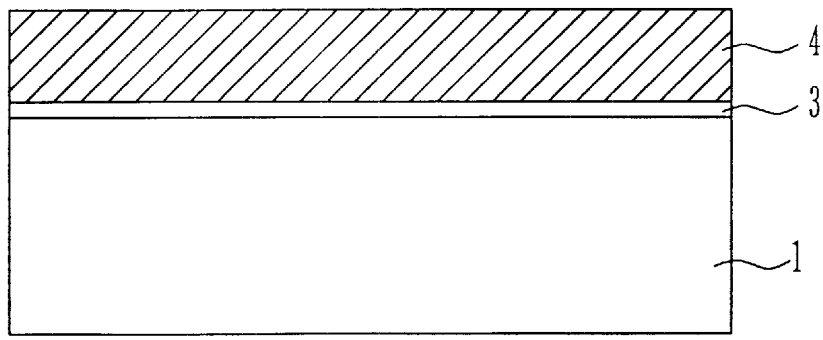
Figure 5B:
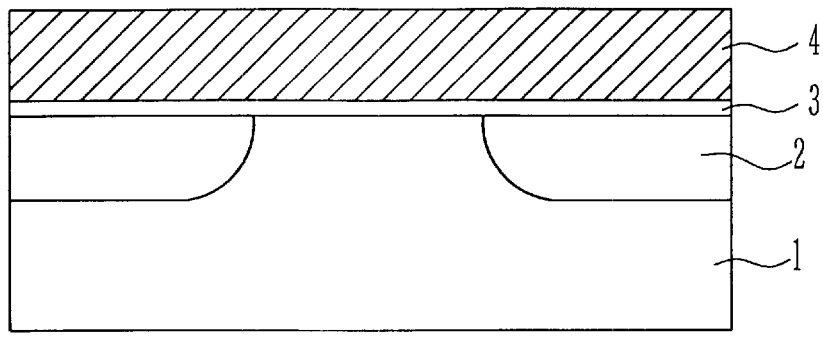

By reference to FIGS. 5A and 5B, the tunnel oxide film 3 and the polysilicon layer 4 are sequentially formed on the semiconductor substrate 1. The tunnel oxide film 3 may be formed by thermally oxidizing an exposed surface of the semiconductor substrate 1 or by performing a deposition process. The first polysilicon layer 4 is formed by growing amorphous silicon (not shown) not doped on the tunnel oxide film 3 using chemical vapor deposition (CVD) and then implanting/annealing arsenic (or phosphorous, boron) ions on the amorphous silicon. At this time, an oxide film is formed on the amorphous silicon in order to control the depth of ion implantation to a given range. The oxide film after the ion implantation process is removed by etching solution (for example, HF solution). At this time, the polysilicon layer 4 may be formed by annealing amorphous silicon to form polysilicon and then accumulating/annealing PSG (phosphosilicate glass), BSG (borosilicate glass), and the like on it to diffuse phosphorous or boron contained in the PSG or BSG, and the line into polysilicon.

Figure 6A:
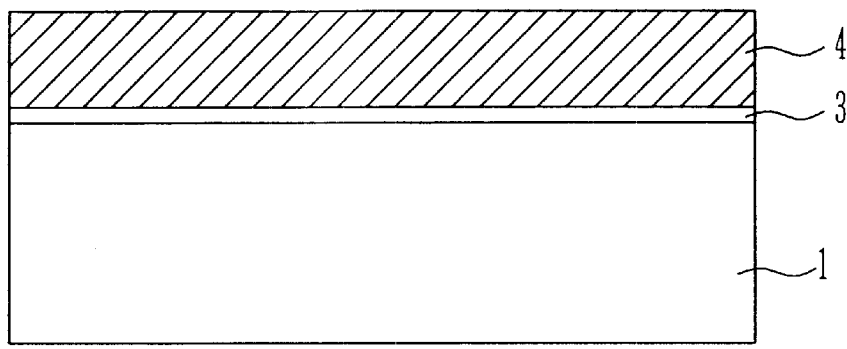
Figure 6B:
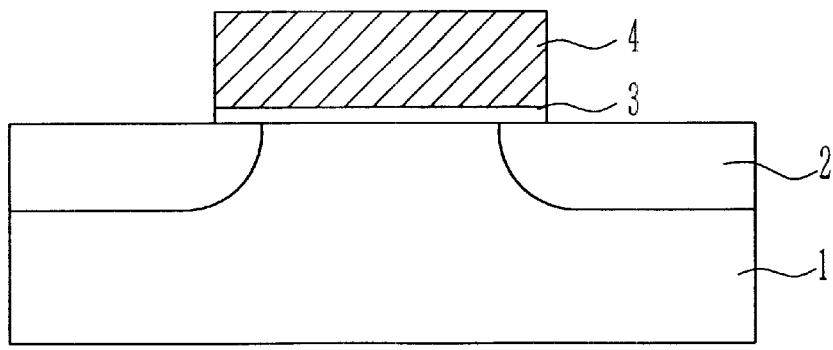

Referring now to FIGS. 6a and 6b, the floating gate electrode 4 and the tunnel oxide film 3 on the device isolation region in which the device isolation film 2 is formed are patterned by a common photolithography and given etching method.

Figure 7A:
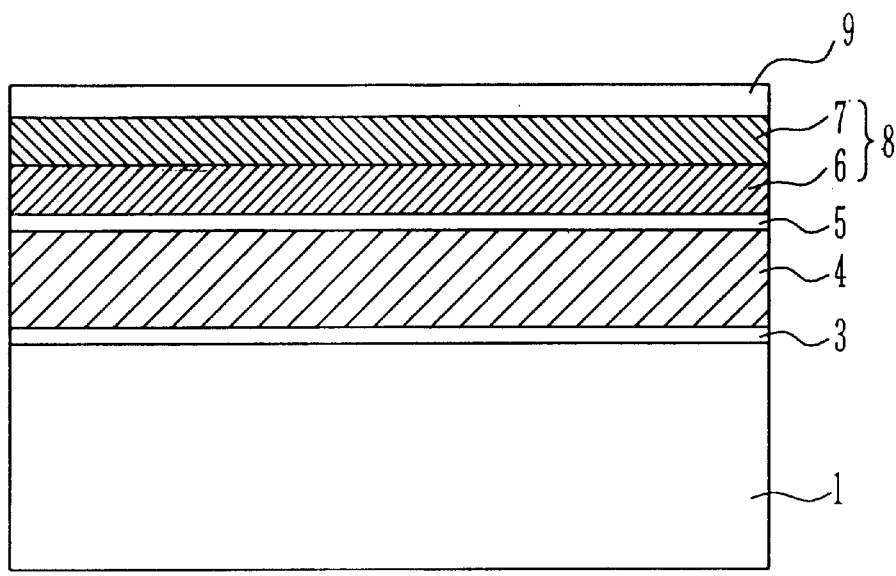
Figure 7B:
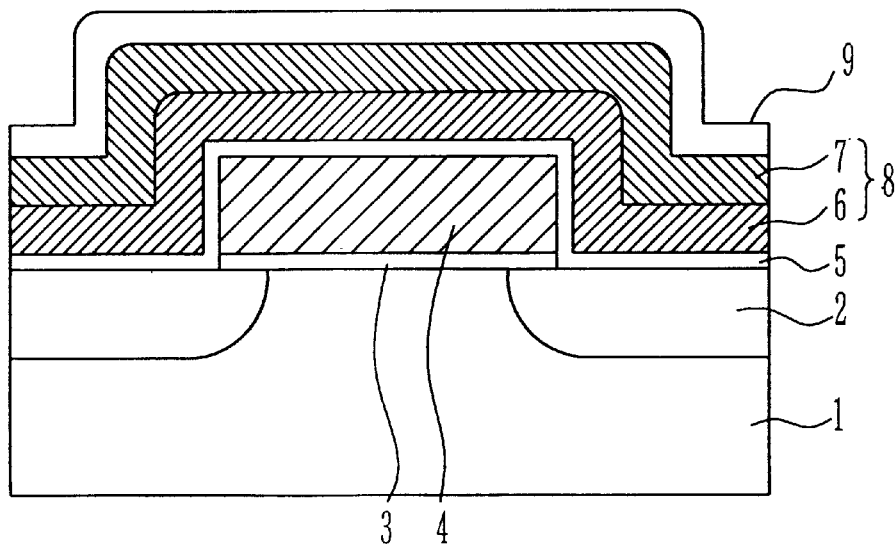

By reference to FIGS. 7A and 7B, an upper surface of the polysilicon layer 4 is thermally oxidized to grow a first oxide film on the floating gate electrode 4. Then, a silicon nitride film is stacked by means of LPCVD method and a second oxide film (called HTO film) is then stacked on the silicon nitride film by means of LPCVD method, thus forming a dielectric film 5 of a three-layer structure (ONO structure). At this time, the first oxide film may be formed of HTO. At the same, in case that the first oxide film is formed by oxidizing the first polysilicon layer 4, a dry oxidization method is used in order for the first oxide film to have a good control property. Further, the dielectric film 5 may be formed with a single layer insulating film formed of a thermal oxide film instead of the ONO insulating film. Thereafter, a second polysilicon layer 6, a tungsten nitride film (WN)/tungsten (W) 7 and a hard mask layer 9 to be used as a mask upon a self align etch (SAE) process are sequentially formed on the dielectric film 5.

Figure 8A:
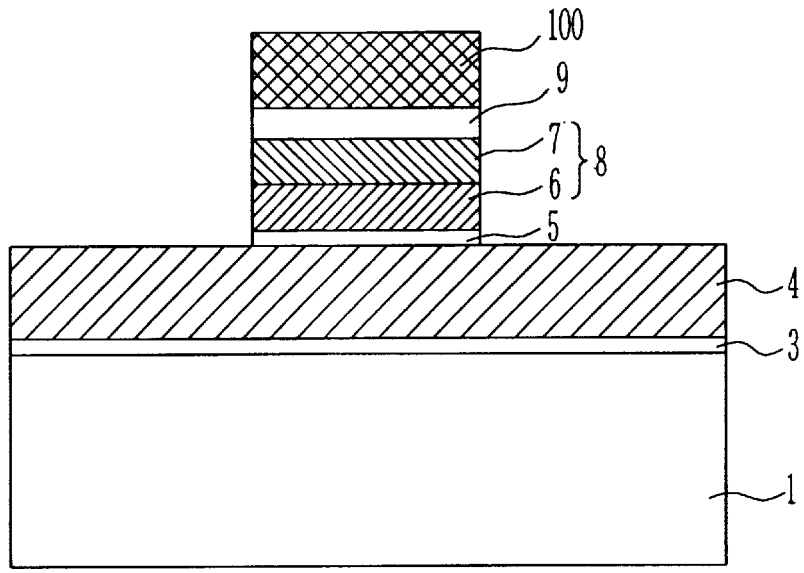
Figure 8B:
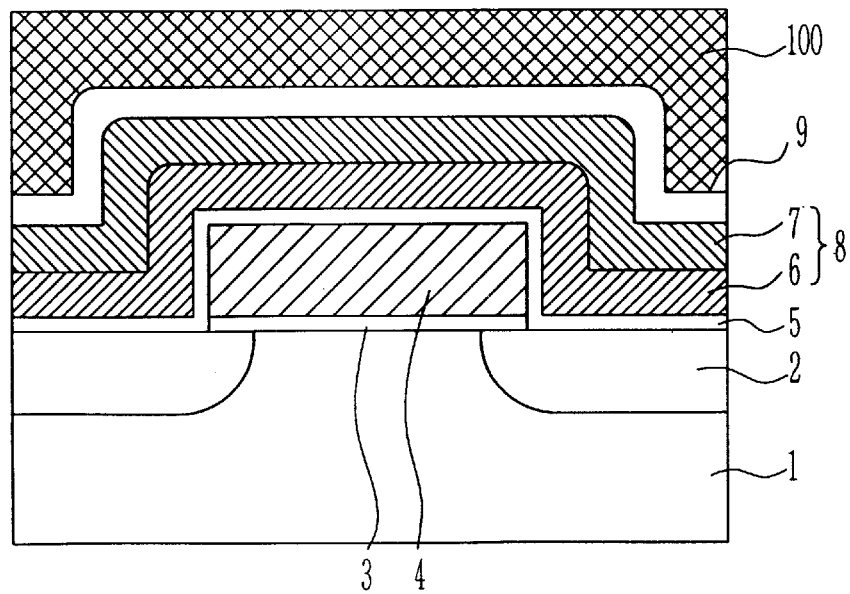

Referring now to FIGS. 8A and 8B, a photoresist reacting with light is deposited on the entire structure. Then, a photoresist pattern 100, that is pattern in a given shape by means of exposure process using the photomask, is formed. Thereafter, the hard mask layer 9, the tungsten nitride film (WN)/tungsten (W) 7 and the dielectric film 5 are sequentially etched by means of etch process using the photoresist pattern 100 as a mask to form a control gate electrode 8. Next, the photoresist pattern 100 is removed by means of given strip process.

Figure 9A:
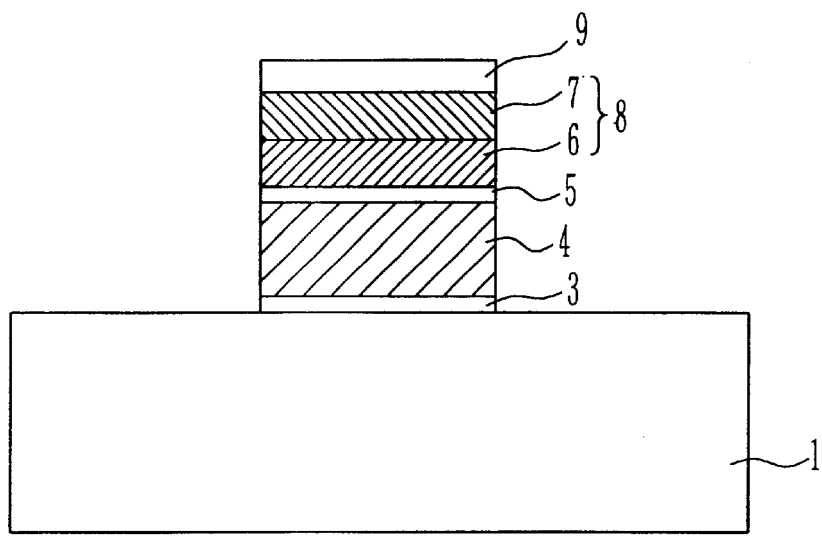
Figure 9B:
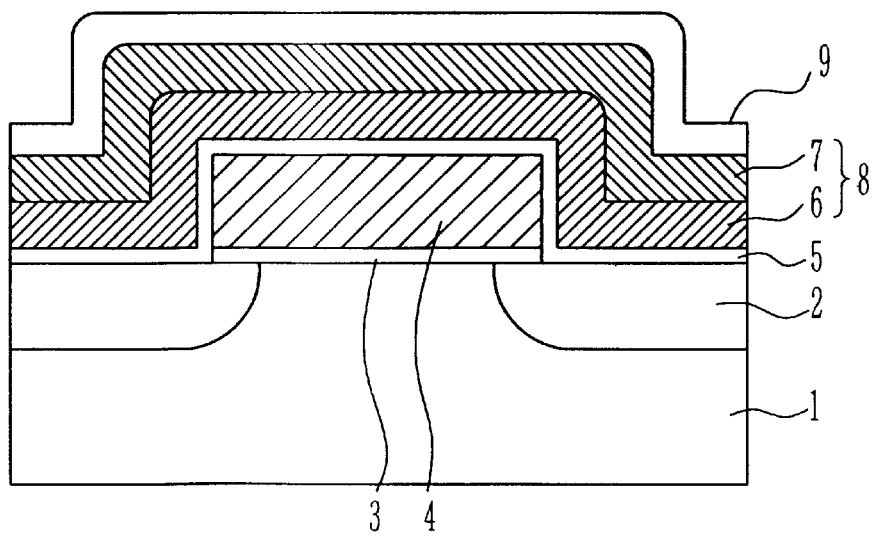

Then, by reference to FIGS. 9a and 9b, the first polysilicon layer 4 and the tunnel oxide film 3 are sequentially etched by means of self align etch (SAE) process to form a floating gate electrode 4a. At this time, regions of the active region where the source region 10 and the drain region 11 will be formed are etched by the etch process.

In the present invention, a subsequent process of manufacturing the device isolation region is the same to the conventional process. Thus, a detailed description on the process of manufacturing the device isolation region will be omitted and only the active region will be explained.

Figure 10:
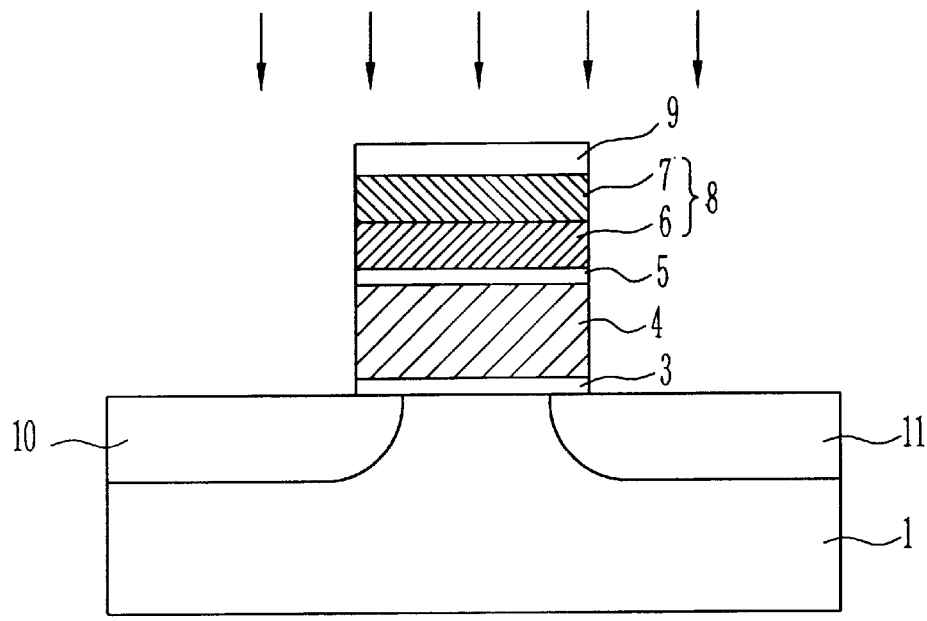

Referring now to FIG. 10, a source region 10 and a drain region 11 are formed in the active region by means of source/drain ion implantation process using source/drain ion implantation mask. The source/drain ion implantation process may be performed in a single step using an ion implantation energy of about 5 Kev~30 keV or of about 15 KeV~45 KeV or may be performed in two steps using an ion implantation energy of about 5 KeV~30 keV is performed and then an ion implantation energy of about 15 KeV~45 KeV.

Figure 11:
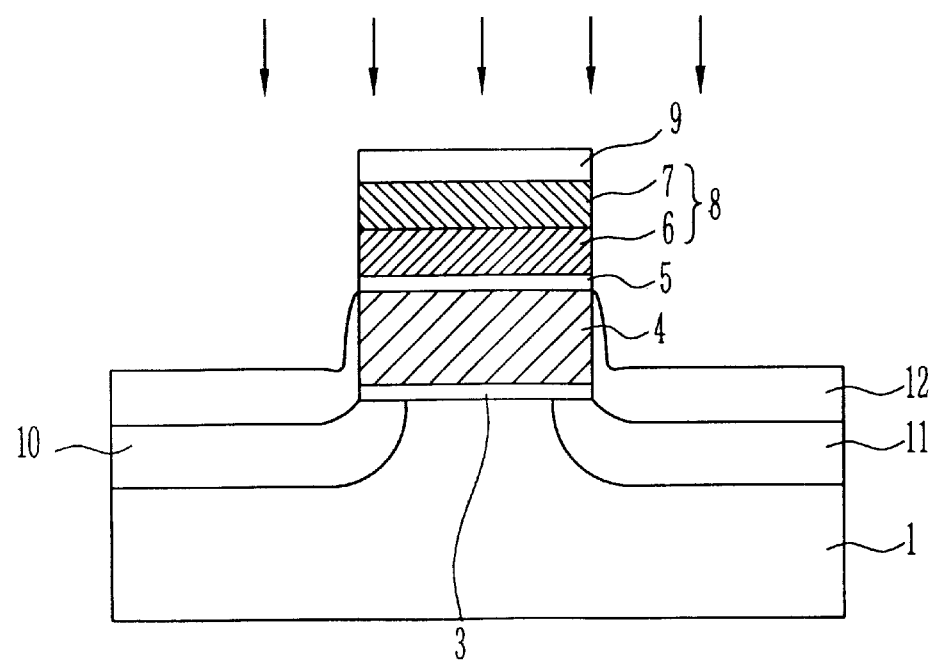

Referring now to FIG. 11, an oxide layer 12 is formed on both sidewalls of the floating gate electrode 4a, and on the source region 10 and the drain region 11 by means of selective oxidization process. At this time, the selective oxidization process uses a hydrogen gas in order to prevent abnormal oxidation of the tungsten nitride film (WN)/tungsten (W) 7. Also, the selective oxidization process may be performed once again before the ion implantation process for forming the source region 10 and the drain region 11.

Figure 12:
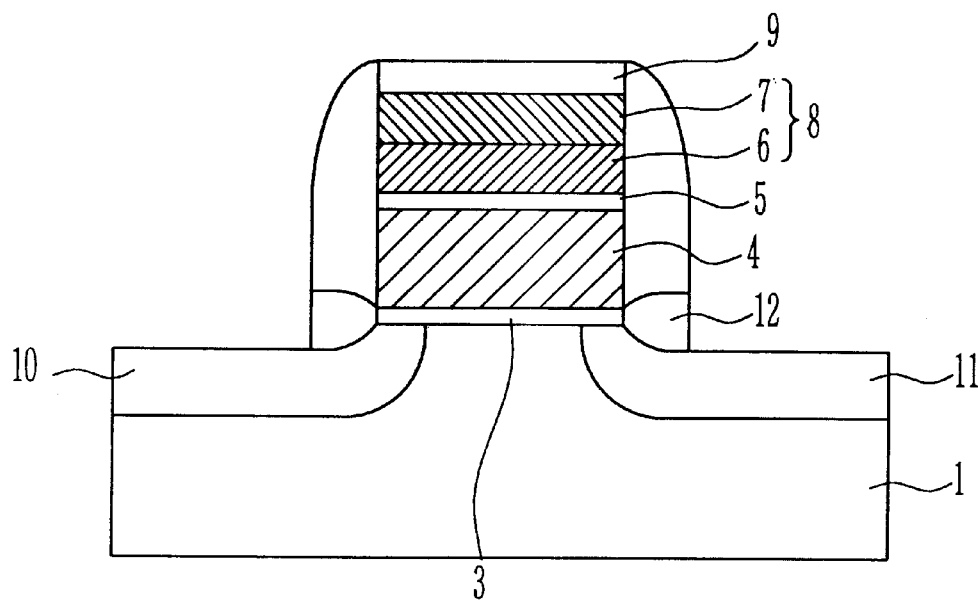

By reference to FIG. 12, an insulating film for a gate spacer is formed on the entire surface. Then, spacers 13 are formed on both sides of the gate electrodes by means of etch process. By means of the etch process, the oxide layer 12 is etched in one direction to the spacer 13 to expose given portions of the source region 10 and the drain region 11.

As mentioned above, the selective oxidization process is performed under the same process to a common selective oxidization process (for example, a process time of about 2~7 minutes). Even with this oxidization process, the oxide layer 12 is formed in thickness of about 50 Å~400 Å. This thickness is much thicker than that of the oxide film formed under the same conventional selective oxidization process (for example, about 20 Å~50 Å). The reason why the thickness of the oxide film 12 according to the first embodiment of the present invention is much thicker than that formed under the same conventional selective oxidization process is that the ion implantation process for forming the source region 10 and the drain region 11 is performed before the selective oxidization process. In other words, this is because that a region of the semiconductor substrate 1 into which impurity is implanted, for example, the source region 10 and the drain region 11 are much faster oxidized than a region of the semiconductor substrate 1 into which impurity is not implanted.

The nonvolatile memory cell according to the second embodiment of the present invention will be below described.

Figure 13:
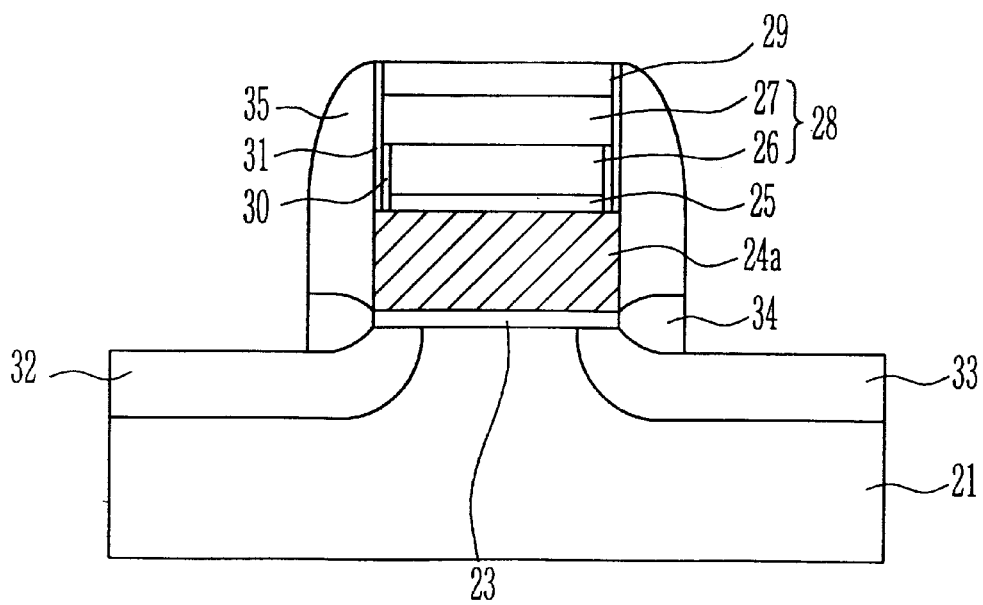
FIG. 13 is a cross-sectional view of the nonvolatile memory cell taken along lines 'X1—X1' in FIG. 1 according to the second embodiment of the present invention.

A structure of the memory cell according to the second embodiment of the present invention is almost same to the structure of the memory cell shown in FIG. 1. Only difference lies in that the second embodiment performs a first selective oxidization process to form a first oxide layer 30 on the sides of a second polysilicon 26 and a dielectric film 25 both of which are over-etched by blanket etch process, before a floating gate electrode 24a in the memory cell MC is patterned, as shown in FIG. 13.

Also, the second embodiment of the present invention secures an effective channel length margin of the memory cell by forming the width of the floating gate electrode 24a wider than the width of the control gate electrode 28.

FIGS. 14~18 are cross-sectional views for explaining a process of manufacturing of the flash memory cell according to the second embodiment of the present invention, which show cross-sectional views taken along lines 'X1—X1' in FIG. 1. In this paragraph, the active region only will be explained. As the step of forming the hard mask layer is same to the first embodiment, the explanation thereof will be omitted and subsequent processes thereof will be explained below.

Figure 14:
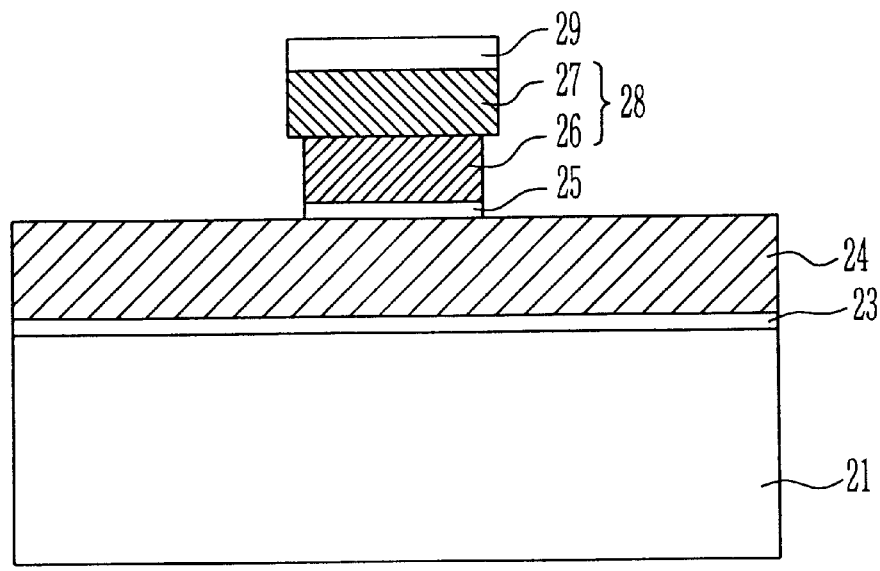
FIGS. 14, 15, 16, 17, 18 and 19 are cross-sectional views for explaining a process manufacturing of the nonvolatile memory cell shown in FIG. 13.

Referring now to FIG. 14, a photoresist is formed on the entire structure. Then, a photoresist pattern (not shown) is formed by exposure process using the photo mask. Thereafter, the hard mask layer 29, the tungsten nitride film (WN)/tungsten (W) 27, the second polysilicon layer 26 and the dielectric film 25 are etched in one direction by means of the etch process using the photoresist pattern, thus forming a control gate electrode 28. In this process, both sides of the second polysilicon layer 26 being a lower layer in the control gate electrode 28 and the dielectric film 25 are over-etched. This is because that the etch rat of the second polysilicon layer 26 and the dielectric film 25 is higher than that of the tungsten nitride film (WN)/tungsten (W) 27 being an upper layer in the control gate electrode 28.

Figure 15:
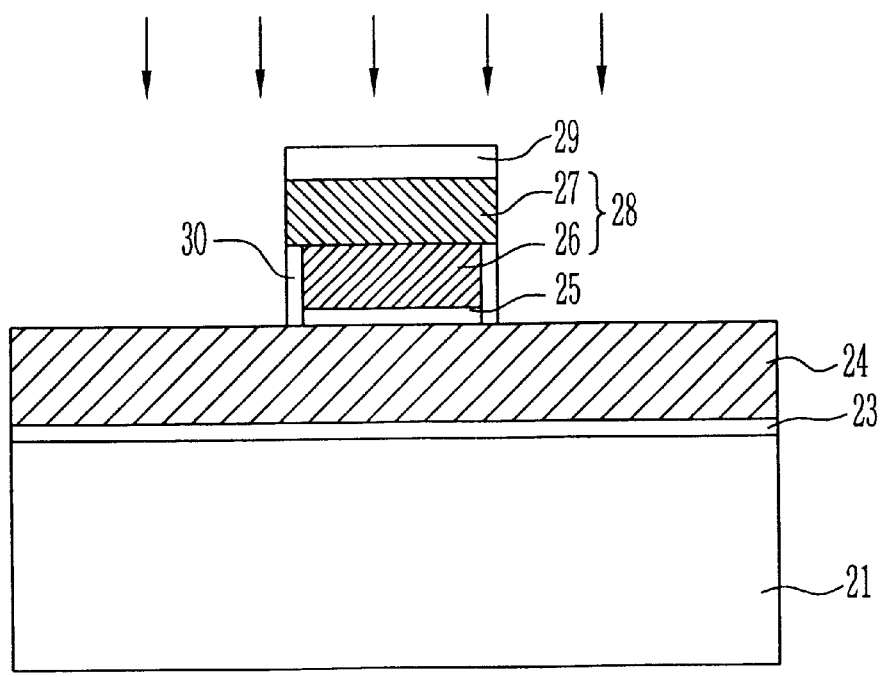

By reference to FIG. 15, the first selective oxidization process is performed to form a first oxide layer 30 on both sides of the second over-etched polysilicon layer 26 and the dielectric film 25. The first selective oxidization process is performed using hydrogen.

Figure 16:
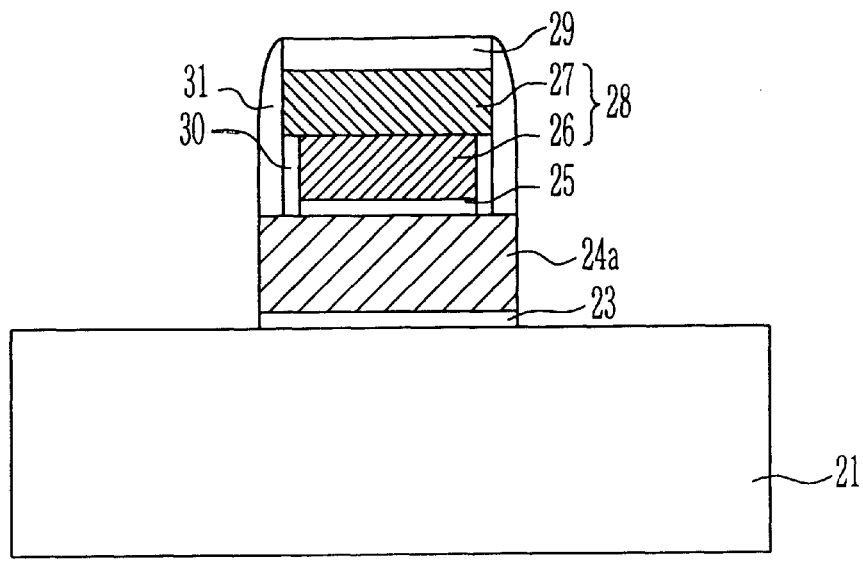

Referring now to FIG. 16, an insulating film for a control gate electrode spacer is formed on the entire surface. Then, the insulating film for a control gate electrode spacer is etched using etching process to form a first spacer 31 on both sides of the control gate electrode 28. Next, a self align etch (SAE) process is performed to sequentially etch the first polysilicon layer 24 and the tunnel oxide film 23, thus forming a floating gate electrode 24a. In this process, as the floating gate electrode 24a is experienced by self align etch (SAE) process using the first spacer 31 as a mask, the width of the floating gate electrode 24a is formed to be wider than that of the control gate electrode 28, so that an effective channel length margin of the memory cells can be secured.

Figure 17:
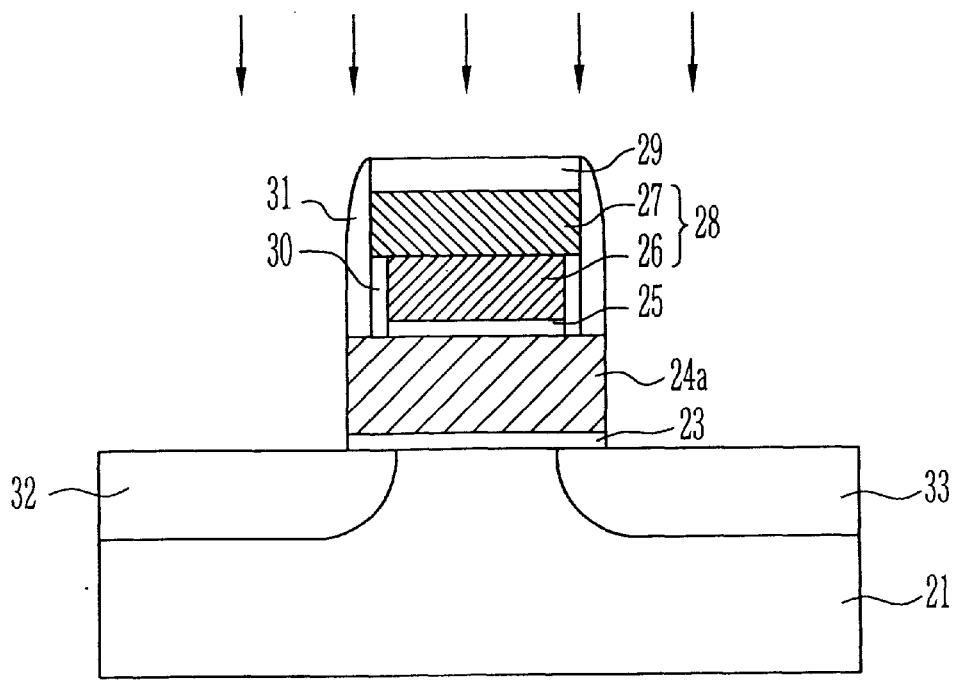

By reference to FIG. 17, source/drain ion implantation process using a source/drain ion implantation mask is performed to form a source region 32 and a drain region 33 in the active region. The source/drain ion implantation process may be performed in a single step using an ion implantation energy of about 5 Kev~30 keV or of about 15 KeV~45 KeV or may be performed in two steps using an ion implantation energy of about 5 KeV~30 keV is performed and then an ion implantation energy of about 15 KeV~45 KeV.

Figure 18:
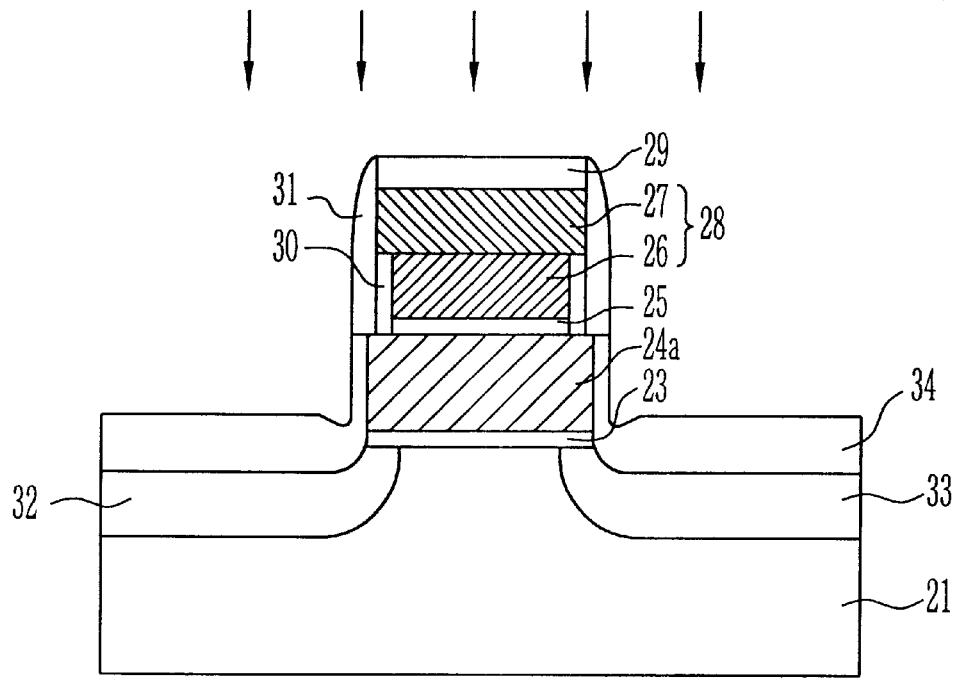

Referring now to FIG. 18, a second selective oxidation process is performed to form a second oxide layer 34 having a thickness of about 50 to 400 angstroms on both sides of the floating gate electrode 24a, and on the source region 32 and the drain region 33 wherein the second selective oxidation process uses hydrogen gas.

Figure 19:
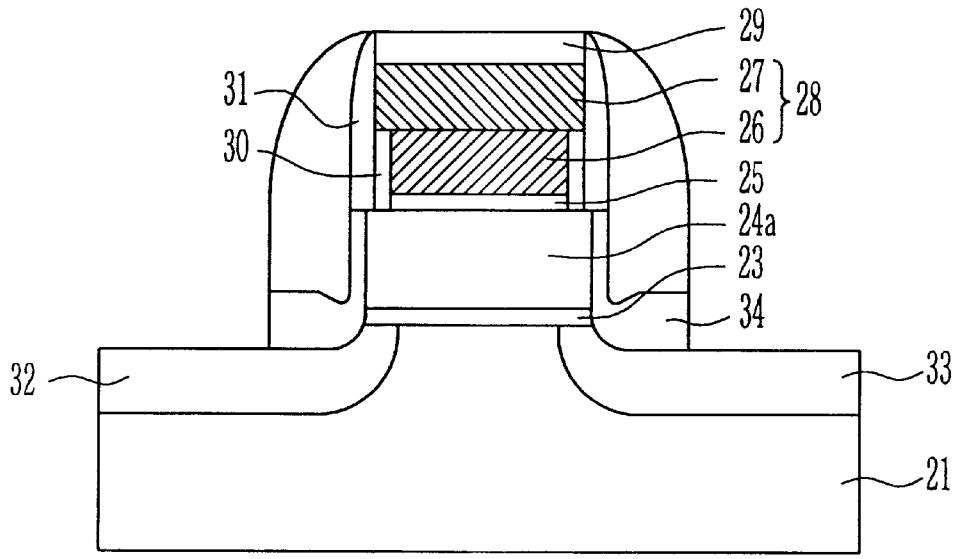

Referring to FIG. 19, an insulating film for a gate electrode spacer is formed on the entire structure. A second spacer 35 is formed on both sides of the gate electrodes by etch process. The second oxide layer 34 is etched in one direction to the second spacer 35 to expose given portions of the source region 32 and the drain region 33.

As can be understood from the above description, the present invention has an advantage that is can reduce a RC delay time of word lines depending on integration of the memory cell by forming a gate electrode using tungsten (W).

Also, as a control gate is pattern/formed and spacers are formed on both sides of the control gate, the present invention can prevent a lift of a dielectric film by a subsequent selective oxidization process.

Further, the present invention forms a floating gate electrode using the spacer as a mask. Thus, the present invention can flexibly change the length of the floating gate electrode to obtain a channel length margin.

In addition, the present invention first performs a source/drain ion implantation process for forming source and drain region before the selective oxidization process in order to promote the speed of oxidization an edge portion of the tunnel oxide film. Therefore, a given distance between the semiconductor substrate and the tunnel oxide film can be secured to solve a data retention problem of the flash memory cell.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a nonvolatile memory cell, the method comprising the steps of:
   sequentially forming a tunnel oxide film, a first polysilicon layer, a dielectric film, a second polysilicon layer, a tungsten layer and a hard mask layer on a semiconductor substrate;
   etching said hard mask layer, said tungsten layer, said second polysilicon layer and said dielectric film in one direction to form a control gate electrode;
   performing a first selective oxidation process to form a first oxide layer on both sides of said second polysilicon layer and said dielectric film;
   forming a first spacer on both sides of said control gate electrode;
   etching said first polysilicon layer and said tunnel oxide film to form a floating gate electrode;
   performing a source/drain ion implantation process to form a source region and a drain region;
   performing a second selective oxidation process to form a second oxide layer on said source and said drain regions; and
   forming a second spacer on both sides of said floating gate electrode and said control gate electrode.

2. The method of manufacturing a nonvolatile memory cell according to claim 1, wherein said source/drain ion implantation process is performed in a single step using an ion implantation energy of either about 5 Kev~30 keV or about 15 KeV~45 KeV.

3. The method of manufacturing a nonvolatile memory cell according to claim 1, wherein said source/drain ion implantation process is performed in two steps by first using an ion implantation energy of about 5 KeV~30 keV and then using an ion implantation energy of about 15 KeV~45 KeV.

4. The method of manufacturing a nonvolatile memory cell according to claim 1, wherein said second oxide layer is formed having a thickness of about 50 Å~400 Å.

5. The method of manufacturing a nonvolatile memory cell according to claim 1, wherein said dielectric film is formed either having a stack structure including a first oxide film, a nitride film and a second oxide film, or having a single layer of the first oxide film.

6. The method of manufacturing a nonvolatile memory cell according to claim 1, wherein said first and said second selective oxidization processes use hydrogen gas.

* * * * *